United States Patent [19]
Fuse

[11] Patent Number: 5,506,851
[45] Date of Patent: Apr. 9, 1996

[54] ANALOG-DIGITAL MIXED MASTER INCLUDING THEREIN A TEST CIRCUIT

[75] Inventor: Mamoru Fuse, Tokyo, Japan

[73] Assignee: NEC Corporation, Tokyo, Japan

[21] Appl. No.: 461,542

[22] Filed: Jun. 5, 1995

Related U.S. Application Data

[63] Continuation of Ser. No. 40,017, Mar. 30, 1993, abandoned.

[30] Foreign Application Priority Data

Mar. 30, 1992 [JP] Japan ............................ 4-074673

[51] Int. Cl.$^6$ .......................................... G01R 31/3167
[52] U.S. Cl. .................... 371/22.1; 371/22.6; 324/158.1
[58] Field of Search ................................ 371/22.1, 22.3, 371/22.5, 22.6; 364/488, 489, 490, 578; 324/158.1, 73.1

[56] References Cited

U.S. PATENT DOCUMENTS

| | | | |
|---|---|---|---|
| 3,896,417 | 7/1975 | Beecham | 395/250 |
| 4,349,821 | 9/1982 | Vancsa | 340/870.21 |
| 4,380,757 | 4/1983 | Vancsa | 341/120 |
| 4,860,290 | 8/1989 | Daniels et al. | 371/22.3 |
| 4,922,492 | 5/1990 | Fasang et al. | 371/22.1 |
| 5,084,824 | 1/1992 | Lam et al. | 364/490 |
| 5,107,208 | 4/1992 | Lee | 371/22.5 X |
| 5,173,904 | 12/1992 | Daniels et al. | 371/22.3 |
| 5,225,834 | 7/1993 | Imai et al. | 371/22.1 X |
| 5,387,862 | 2/1995 | Parker et al. | 371/22.3 X |
| 5,404,358 | 4/1995 | Russel | 371/22.3 |

OTHER PUBLICATIONS

Fasang et al., "Design For Testability For Mixed Analog/Digital ASIC's", IEEE 1988 Custom IC Conf., May 1988, pp. 16.5.1–16.5.4.

*Primary Examiner*—Emanuel T. Voeltz
*Assistant Examiner*—Eric W. Stamber
*Attorney, Agent, or Firm*—Whitham, Curtis, Whitham & McGinn

[57] ABSTRACT

In an analog-digital mixed master for a Bi-CMOS analog/digital mixed LSI, an analog circuit and a digital circuit are interconnected through selectors, which are also connected to test terminals and which are controlled by test mode terminals. By changing the signals applied to the test mode terminals, the analog circuit and the digital circuit are interconnected through the selectors, or the analog circuit is connected through the selectors to the test terminals, or the digital circuit is connected through the selectors to the test terminals. Thus, the analog circuit and the digital circuit can be tested independently of each other.

8 Claims, 5 Drawing Sheets

T TEST TERMINAL

AT, DT : TEST MODE TERMINAL

ANALOG-DIGITAL MIXED MASTER INCLUDING THEREIN A TEST CIRCUIT

This application is a continuation of application Ser. No, 08/040,017, filed Mar. 30, 1993, now abandoned.

BACKGROUND OF THE INVENTION

1. Field of the Invention

The present invention relates to an analog-digital mixed master including a test circuit therein, and more specifically to an undelayer-fixed analog-digital mixed master including therein a test circuit for a Bi-CMOS analog/digital mixed LSI.

2. Description of Related Art

Recently, analog/digital mixed LSIs have been built to implement a large-scale analog circuit of high precision and a large-scale logic circuit on a single chip with development of Bi-CMOS (bipolar transistor/complementary metal-oxide-semiconductor transistor) process. Under this circumstance, a high speed operation, a low noise and a low power consumption have been demanded for an analog circuit section in the analog/digital mixed LSIs, and in addition, the analog circuit section is large-scale, because A/D converters, D/A converters and filters are implemented in the analog circuit section. On the other hand, the large-scale and the high speed are being rapidly advanced in the digital circuit section.

As a method for developing the analog/digital mixed LSIs, there has been conventionally widely adopted a process in which an analog circuit is designed by a manual means and a digital circuit is designed in a standard cell system, and then, both of the circuits are integrated on a single chip. This process has been advantageous since it is possible to design LSIs having many variations, but has been disadvantageous in that a long time period has been required for development, and therefore, a development expense has inevitably become high.

In order to compensate for the disadvantage of the conventional analog/digital mixed LSIs, there is an underlayer-fixed analog-digital mixed master system, in which an analog master composed of various analog circuit element such as transistors, resistors, capacitors, etc. which are located in the form of an array, and a digital gate array are previously implemented on a single chip. This can greatly reduce the development term and the development expense. On the other hand, with the shortening of the development term, it has become significant to analyze causes of malfunctions when the malfunctions have occurred in an operation of the LSI. In particular, because of complication of the circuits, a test method for discovering and eliminating defective chips has become more important.

In the prior art, for small-scale analog/digital mixed LSIs, the test has been performed without clearly separating the analog circuit section and the digital circuit section from each other. Namely, an analog signal and a digital signal are separately supplied to the analog circuit section and the digital circuit section, respectively, and a value of an output signal outputted from the analog circuit section and a pattern of signals outputted from the digital circuit section are derived from a manual calculation or a simulation.

However, in the conventional testing method for the analog/digital mixed LSIs, preparation of a test program needs a detailed thorough understanding of the whole of the analog circuit section and the digital circuit section, and in addition, the testing program itself is complicated.

In developing large-scale analog/digital mixed LSIs, it has been an ordinary practice that the design of the analog circuit section and the design of the digital circuit section are separately performed by different designers. Under this development structure, therefore, it has been difficult to prepare the testing program with the thorough understanding of the whole operation.

In addition, complication of the testing program makes it difficult to completely debug the testing program, and a long time period is necessary until the testing program becomes stable. Accordingly, the conventional test method as mentioned above for the analog/digital mixed LSIs is not convenient to the underlayer-fixed analog-digital mixed master in which the development term is the most preferential.

Furthermore, the conventional test method for the analog/digital mixed LSIs fails to easily determine which of the analog circuit section and the digital circuit section is defective, when malfunction occurs in the LSI.

SUMMARY OF THE INVENTION

Accordingly, it is an object of the present invention to provide an underlayer-fixed analog/digital mixed master including therein a test circuit for a Bi-CMOS analog/digital mixed LSI, which master has overcome the above mentioned defect of the conventional one.

Another object of the present invention is to provide an underlayer-fixed analog-digital mixed master including therein a test circuit for a Bi-CMOS analog/digital mixed LSI, which master permits for a test to be easily carried out, and can remarkably shorten the test program development term.

The above and other objects of the present invention are achieved in accordance with the present invention by an analog-digital mixed master for an analog-digital mixed semiconductor integrated circuit including an analog circuit section composed of bipolar devices arranged in an array, and a digital circuit section composed of a CMOS gate array, the analog-digital mixed master comprising a plurality of selector circuits connected between the analog circuit section and the digital circuit section for switching a connection condition between the analog circuit section and the digital circuit, and a test mode switching terminal receiving a test mode control signal and connected to the selector circuits for setting the selector circuits in a selected test mode.

In the above mentioned analog-digital mixed master in accordance with the present invention and including the test circuit therein, each of the selector circuits functions as an interface between the analog circuit section and the digital circuit section in the Bi-CMOS analog/digital mixed LSI. Namely, the selector circuits are controlled by a signal applied to the test mode switching terminal, so that, in a non-test mode, one selector circuit transfers a signal from the digital circuit section to the analog circuit section, and another selector circuit transfers a signal from the analog circuit section to the digital circuit section. In a test mode, the selector circuits transfers a signal from a test terminal to the analog circuit section or the digital circuit section or from the analog circuit section or the digital circuit section to the test terminal.

With this arrangement, in accordance with the signal applied to the test mode switching technical, the analog-digital mixed master in accordance with the present invention can test the analog circuit section and the digital circuit section independently of each other, and also can test the conditions of the interconnection between the analog circuit section and the digital circuit section. Accordingly, when a malfunction occurs, the analog-digital mixed master in accordance with the present invention can simply determine in which of the analog circuit section and the digital circuit section the malfunction occurs. In addition, it is possible to prepare a test program for each of the analog circuit section and the digital circuit section, independently of each other.

The above and other objects, features and advantages of the present invention will be apparent from the following description of preferred embodiments of the invention with reference to the accompanying drawings.

DESCRIPTION OF THE PREFERRED EMBODIMENTS

Figure 1:
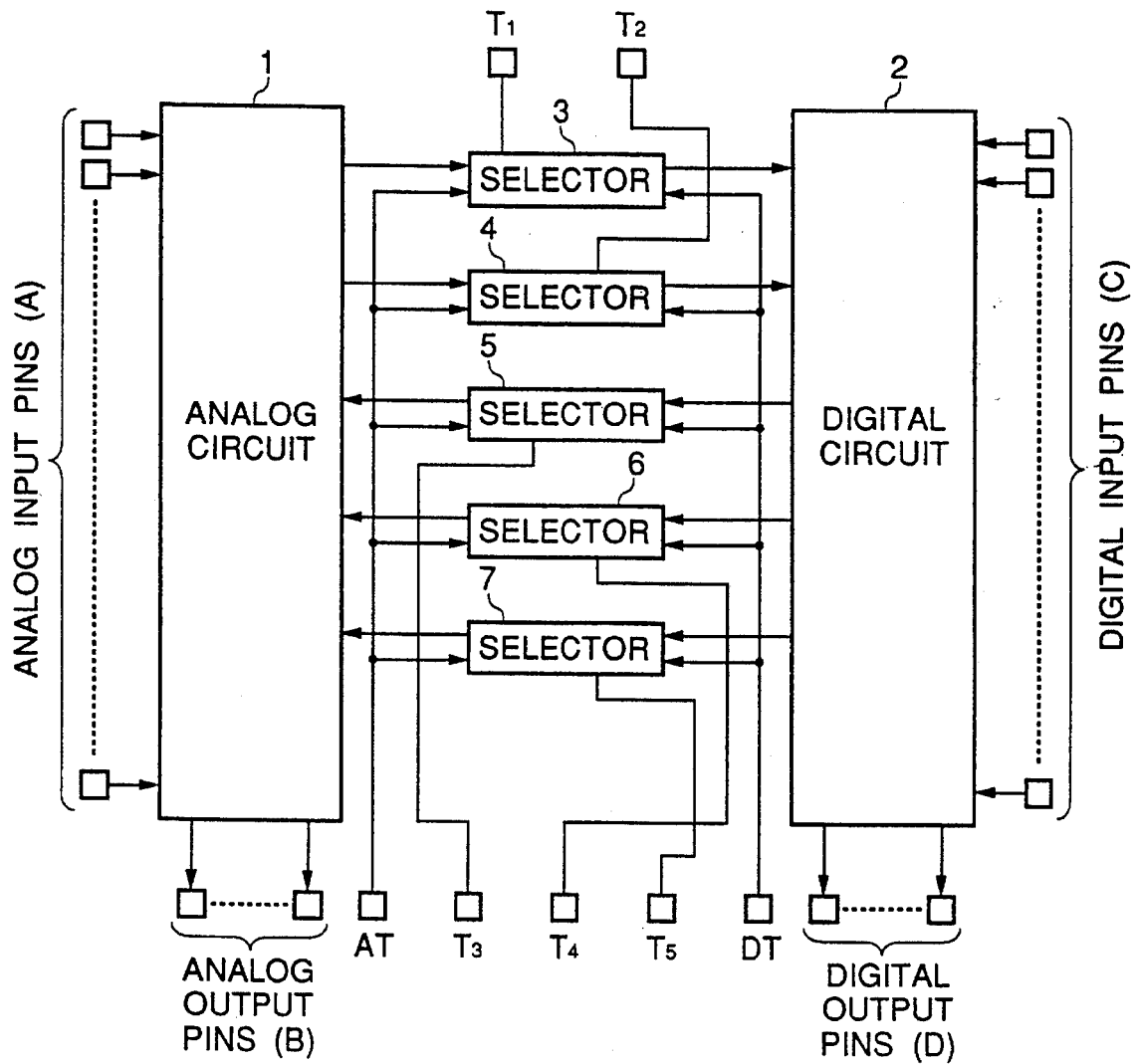
FIG. 1 is a block diagram of a first embodiment of the analog-digital mixed master in accordance with the present invention including a test circuit therein.

Referring to FIG. 1, there is shown a block diagram of a first embodiment of the analog-digital mixed master in accordance with the present invention including a test circuit therein. The shown first embodiment of the analog-digital mixed master in accordance with the present invention includes an analog circuit 1 in which a number of bipolar devices are located in the form of an array or arrays, and a digital circuit section 2 including a CMOS gate array or arrays. The analog circuit 1 and the digital circuit section 2 are interconnected through a number of selectors 3, 4, 5, 6 and 7, as shown.

The shown embodiment also includes various signal lines, which include analog input pins (A) for supplying signals to the analog circuit 1 from a source external to the integrated circuit, analog output pins (B) for outputting signals from the analog circuit 1 to the source external to the integrated circuit, digital input pins (C) for supplying signals to the digital circuit 2 from the source external to the integrated circuit, and digital output pins (D) for outputting signals from the digital circuit 2 to the source external to the integrated circuit. The various signal lines furthermore include internal signal lines for transferring signals from the analog circuit 1 to the digital circuit 2, (only two signal lines are shown in the embodiment of FIG. 1), and internal signal lines for transferring signals from the digital circuit 2 to the analog circuit 1 (only three signal lines are shown in the embodiment of FIG. 1). Namely, two signals are transferred from the analog circuit 1 through the selectors 3 and 4, respectively, to the digital circuit 2, and three signals are transferred from the digital circuit 2 through the selectors 5, 6 and 7, respectively, to the analog circuit 1.

In addition, there are provided a pair of test mode terminals AT and DT for switching the condition of the selectors 3 to 7. The selectors 3 to 7 are connected to test terminals $T_1$, $T_2$, $T_3$, $T_4$ and $T_5$, respectively, each of which receives and outputs a test signal. Since the selectors 3 to 7 are independent of the analog circuit 1 and the digital circuit 2, it is possible for a circuit designer to be able to design the selectors without any restriction of design.

Figure 2:
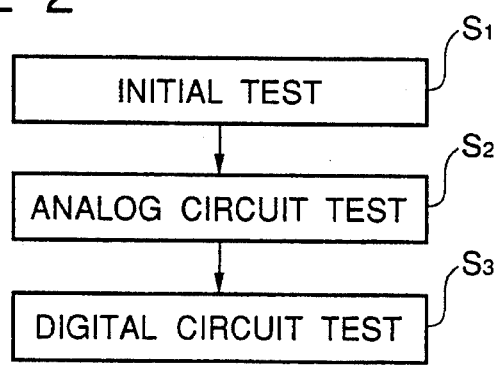
FIG. 2 is a flow chart illustrating the test procedure in the first embodiment shown in FIG. 1.

Now, operation will be explained of the above mentioned first embodiment of the analog-digital mixed master in accordance with the present invention including the test circuit therein. FIG. 2 is a flow chart illustrating the test procedure in the first embodiment shown in FIG. 1.

First, an initial test is performed so as to check an open-circuit and a short-circuit and also to carry out a device checking of circuit elements such as transistors, resistors, etc. (Step "S1"). Next, the analog circuit 1 is tested (Step "S2"), and finally, the digital circuit 2 is tested (Step "S3").

The following is a relation between the conditions of the test mode terminals AT and DT and different modes.

|  | Normal Mode | Analog Test Mode | Digital Test Mode |
| --- | --- | --- | --- |
| Terminal AT | 0 | 1 | 0 |
| Terminal DT | 0 | 0 | 1 |

With reference to the above table, the operation of the first embodiment will be described in detail.

First, the normal mode is set. This normal mode is an ordinary IC operating mode in which various signals are transferred from the analog circuit 1 to the digital circuit 2 and from the digital circuit 2 to the analog circuit 1. In the normal mode, no signal is supplied to the test terminals $T_1$ to $T_5$, so that no signal is supplied from the test terminals to the analog circuit section 1, and therefore, a characteristic of the analog circuit 1, for example, a noise characteristic, is not deteriorated.

Next, the analog test mode is set, in which output signals of the analog circuit 1 are outputted through the selectors 3 and 4 to the test terminals $T_1$ and $T_2$, and digital signals are inputted from the test terminals $T_3$, $T_4$ and $T_5$ through the selectors 5, 6 and 7 to the analog circuit 1. Thus, the analog circuit 1 can be tested in a condition in which the analog circuit 1 is completely separated from the digital circuit 2.

Thereafter, the digital test mode is set. In this digital test mode, digital signals are inputted from the test terminals $T_1$ and $T_2$ through the selectors 3 and 4 to the digital circuit 2, and output signals of the digital circuit 2 are outputted through the selectors 5, 6 and 7 to the test terminals $T_3$, $T_4$ and $T_5$. Accordingly, the digital circuit 2 can be tested in a condition in which the digital circuit 2 is completely separated from the analog circuit 1.

Figure 3:
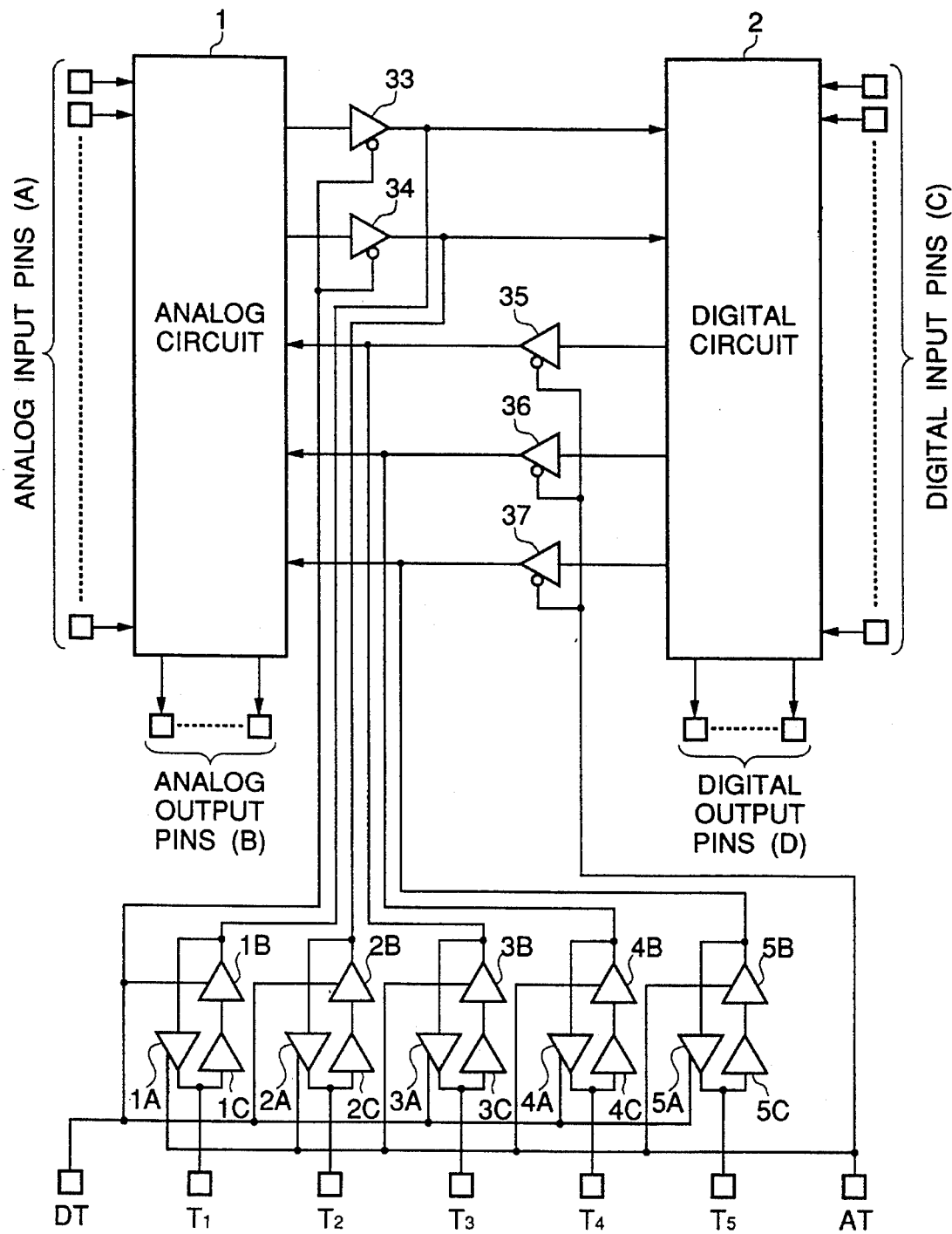
FIG. 3 is a detailed logic circuit diagram of the first embodiment shown in FIG. 1 of the analog-digital mixed master in accordance with the present invention including a test circuit therein.

Referring to FIG. 3, there is shown a detailed logic circuit diagram of the first embodiment shown in FIG. 1 of the analog-digital mixed master in accordance with the present invention including the test circuit therein. In FIG. 3, elements similar or corresponding to those shown in FIG. 1 are given the same Reference Numerals, and explanation thereof will be omitted.

In the circuit shown in FIG. 3, tri-state buffers 33 to 37, 1A to 5A and 1B to 5B connected as shown constitute the selectors 3 to 7 shown in FIG. 1.

Specifically, two outputs of the analog circuit 1 are connected to an input of two tri-state buffers 33 and 34, respectively, whose output is connected to a corresponding input of the digital circuit 2. An inverted control input of each of the tri-state buffers 33 and 34 are connected to the test mode terminal DT. Three outputs of the digital circuit 2 are connected to an input of three tri-state buffers 35, 36 and 37, respectively, whose output is connected to a corresponding input of the analog circuit 1. An inverted control input of each of the tri-state buffers 35, 36 and 37 are connected to the test mode terminal AT.

In addition, the test terminal $T_1$ is connected to an output of a tri-state buffer 1A and an input of an input buffer 1C, which has its output connected to an input of another tri-state buffer 1B. An output of the tri-state buffer 1B is connected to an input of the tri-state buffer 1A and the output of the tri-state buffer 33. Similarly to the test terminal $T_1$, the other test terminals $T_2$, $T_3$, $T_4$ and $T_5$ are connected to the output of the tri-state buffers 34, 35, 36 and 37, respectively, through a buffer circuit constructed similarly to the buffer circuit composed of the three buffers 1A, 1B and 1C.

A non-inverted control input of the tri-state buffers 1B, 2B, 3A, 4A and 5A is connected to the test mode terminal DT, and a non-inverted control input of the tri-state buffers 1A, 2A, 3B, 4B and 5B is connected to the test mode terminal AT.

The first embodiment assumes that all interfacing signals between the analog circuit 1 and the digital circuit 2 are of a digital signal.

First, in the normal mode, the test mode terminals AT and DT are set to "0" and "0", respectively. Therefore, the tri-state buffers 33 and 34 are activated so that the signals outputted from the analog circuit 1 are transferred to the digital circuit 2 through one stage of buffer. On the other hand, the tri-state buffers 1A and 1B and 2A and 2B are brought into a high impedance condition, so that no signal is outputted to the test terminals $T_1$ and $T_2$, nor is a signal inputted from the test terminals $T_1$ and $T_2$.

At the same time, the tri-state buffers 35, 36 and 37 are activated so that the signals outputted from the digital circuit 2 are transferred to the analog circuit 1 through one stage of buffer. On the other hand, the tri-state buffers 3A and 3B, 4A and 4B and 5A and 5B are brought into a high impedance condition, so that no signal is outputted to the test terminals $T_3$, $T_4$ and $T_5$, nor is a signal inputted from the test terminals $T_3$, $T_4$ and $T_5$.

Accordingly, in the normal mode, no interfacing signal is outputted from each of the test terminals. Incidentally, the tri-state buffers 1A to 5A and 1B to 5B are pulled down, so that when the LSI is powered on, the tri-state buffers 1A to 5A and 1B to 5B are automatically set in the normal mode.

Next, in the analog test mode, the test mode terminal AT is set to "1" and the test mode terminal DT is set to "0". Therefore, the tri-state buffers 33 and 34 and 1A and 2A are activated so that the signals outputted from the analog circuit 1 are supplied to the test terminals $T_1$ and $T_2$, respectively. In addition, since the tri-state buffers 3B, 4B and 5B are activated, signals applied to the test terminals $T_3$, $T_4$ and $T_5$ are supplied to the analog circuit 1 through one stage of buffer.

Finally, in the digital test mode, the test mode terminal AT is set to "0" and the test mode terminal DT is set to "1". Therefore, since the tri-state buffers 33 and 34 are brought into the high impedance condition, and the tri-state buffers 1B and 2B are activated, signals applied to the test terminals $T_1$ and $T_2$ are supplied to the digital circuit 2 through one stage of buffer. On the other hand, since the tri-state buffers 35 to 37 and 3A to 5A are activated, the signals outputted from the digital circuit 2 are supplied to the test terminals $T_3$, $T_4$ and $T_5$, respectively.

Figure 4:
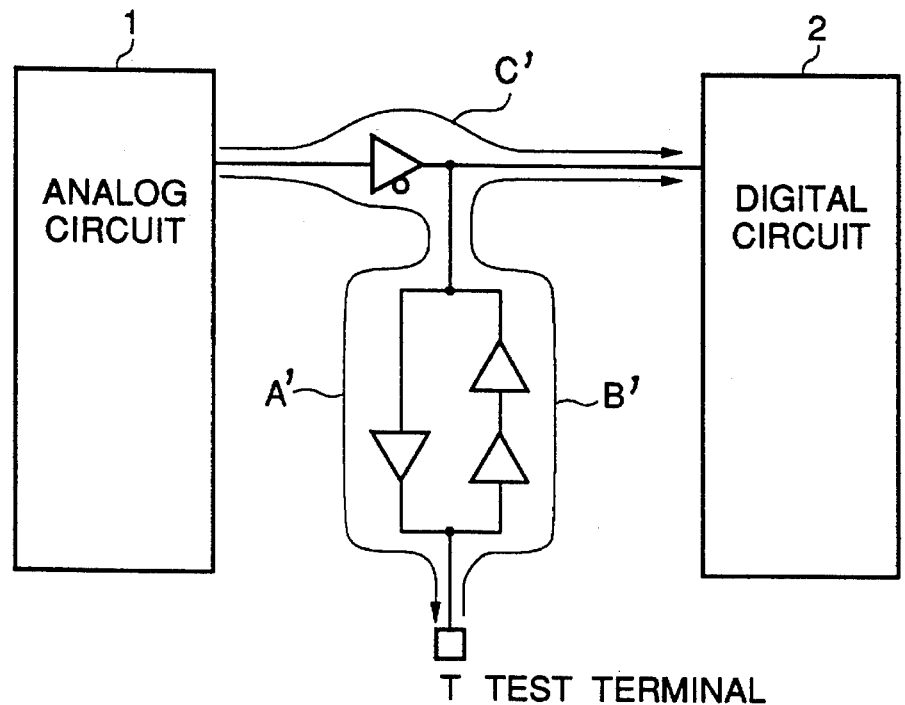
FIG. 4 illustrates a signal transfer path realized in the analog-digital mixed master shown in FIG. 3, in different test modes.

Turning to FIG. 4, there is illustrated a signal transfer path realized in the analog-digital mixed master shown in FIG. 3, in different test modes. In the analog test mode, if the test is passed, a connection for a signal transfer path A' is confirmed. In the digital test mode, if the test is passed, a connection for a signal transfer path B' is confirmed. Therefore, because of creation of the signal transfer paths A' and B', it is possible to test the analog circuit 1 and the digital circuit 2 independently of each other. In addition, if the test is performed to confirm a connection for a signal transfer path C', it is possible to test the interconnection between the analog circuit 1 and the digital circuit 2. Thus, it is possible to guarantee the overall operation of the LSI chip.

Figure 5:
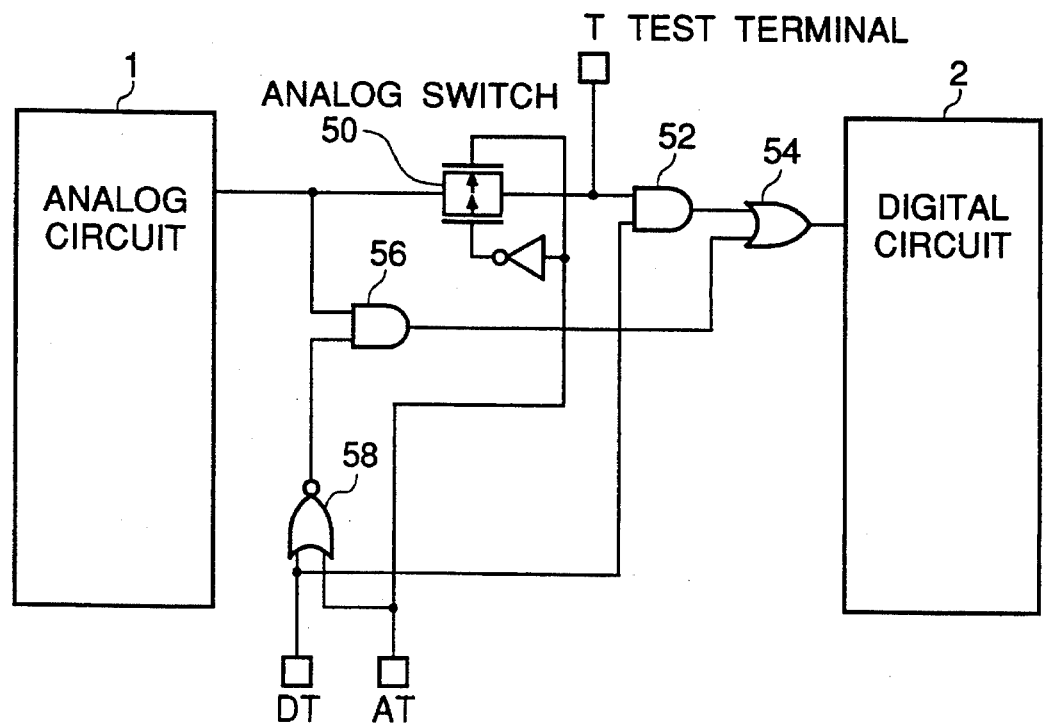
FIG. 5 is a logic circuit diagram of a second example of the selector circuit in the analog-digital mixed master in accordance with the present invention.

Referring to FIG. 5, there is shown a logic circuit diagram of a second example of the selector in the analog-digital mixed master in accordance with the present invention.

The selector shown in FIG. 5 operates similarly to the selector shown in FIG. 3, but has a construction different from that of the selector shown in FIG. 3. In order to test the output of the analog circuit 1 in the form of an analog signal, the selector shown in FIG. 5 includes a bidirectional analog switch 50 connected at its one end to a corresponding output of the analog circuit 1 and at its other end to a corresponding test terminal T and one input of an AND gate 52. An output of the AND gate 52 is connected to one input of an OR gate 54, whose output is connected to a corresponding input of the digital circuit 2. In addition, the corresponding output of the analog circuit 1 is connected to one input of another AND gate 56, whose output is connected to the other input of the OR gate 54. The test terminals AT and DT are connected to inputs of a NOR gate 58, whose output is connected to the other input of the AND gate 56. The test terminal DT is connected to the other input of the AND gate 52. In the shown example, the analog switch 50 is composed of a transfer gate, which has a control terminal connected to the test mode terminal AT.

With this arrangement, in the normal mode, the signal is transferred from the analog circuit 1 to the digital circuit 2 through two stages of buffer. Since the signal actually applied to the digital circuit 2 is limited to a digital signal, the digital signal is supplied from the test terminal T through the AND gate 52 and the OR gate 52 to the digital circuit 2.

Figure 6:
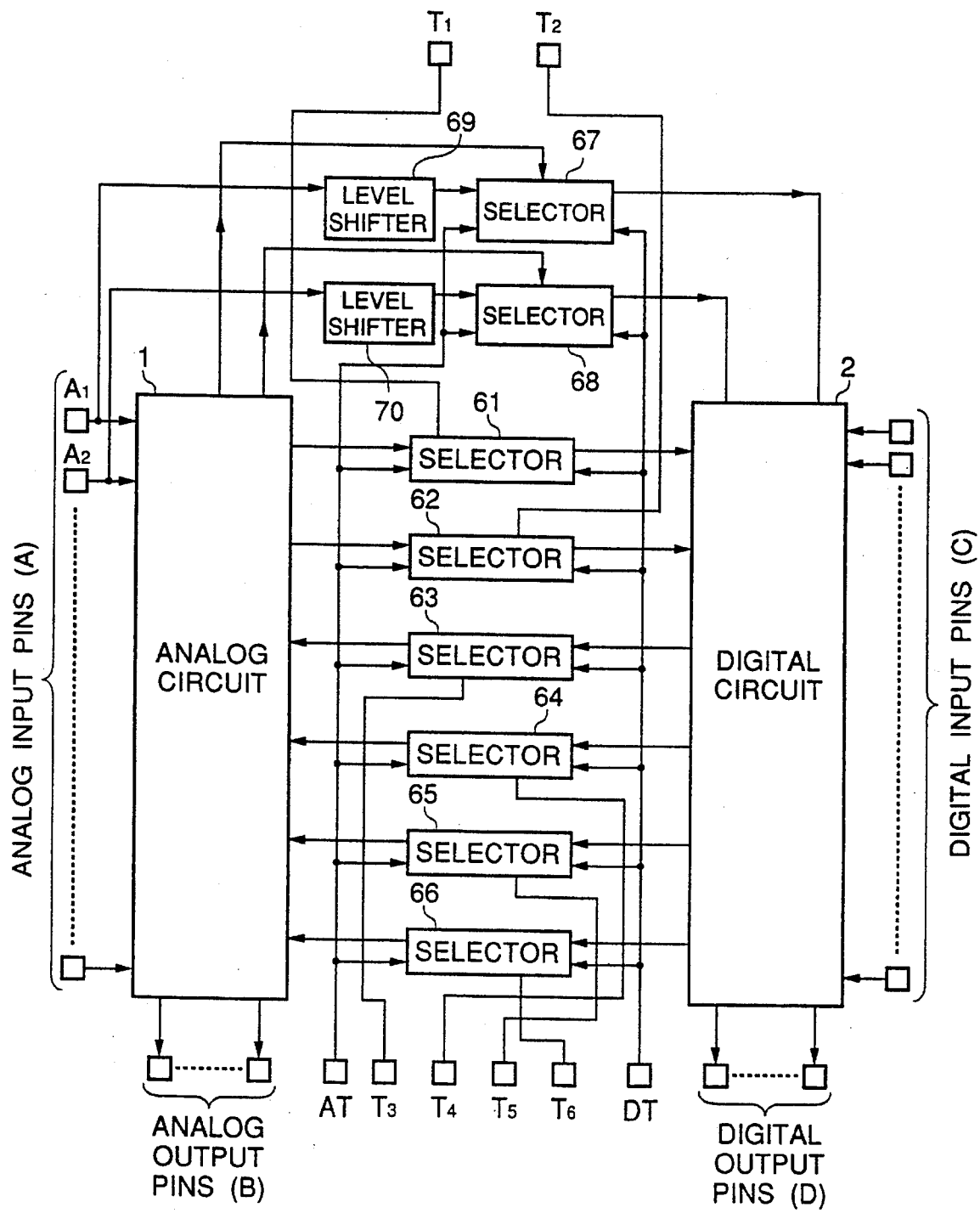
FIG. 6 is a block diagram of a second embodiment of the analog-digital mixed master in accordance with the present invention including a test circuit therein.

Referring to FIG. 6, there is shown a block diagram of a second embodiment of the analog-digital mixed master in accordance with the present invention including a test circuit therein.

As will be seen from FIG. 6, the second embodiment of the analog-digital mixed master is such that the number of interconnections between the analog circuit 1 and the digital circuit 2 is larger than the number of test terminals $T_1$ to $T_6$, and in the case of testing the digital circuit 2, input/output pins or terminals $A_1$ and $A_2$ of the analog circuit 1 an used as test terminals for the digital circuit 2.

Figure 8:
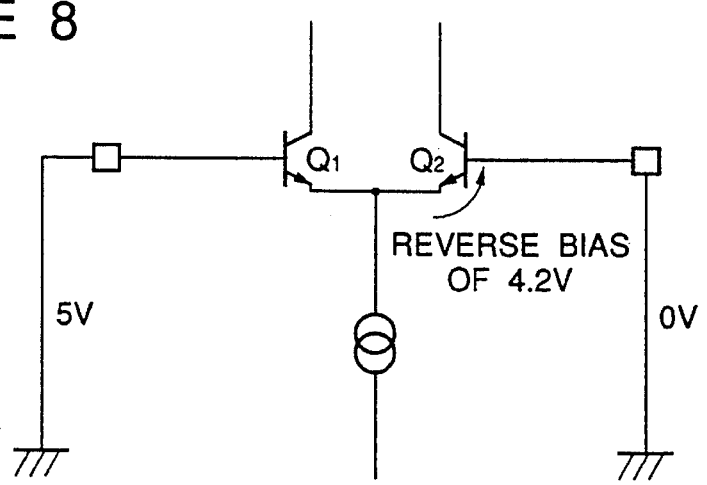
FIG. 8 illustrates a conventional differential circuit.

When the digital circuit 2 is tested, a signal of 0 V to 5 V is ordinarily supplied to the digital circuit 2. On the other hand, in a differential circuit shown in FIG. 8 which is one of typical analog circuits, if a signal of 0 V and a signal of 5 V are supplied to a base of two transistors $Q_1$ and $Q_2$, a base-emitter of the transistor $Q_2$ put into a reverse bias of about 4.2 V, and therefore, there is a fear that the transistor $Q_2$ is broken. Therefore, in the second embodiment shown in FIG. 6, the signals supplied through the input/output terminals $A_1$ and $A_2$ (which are commonly used as the input/output terminals of the analog circuit 1 and the test terminals for the digital circuit 2) are supplied to level shifters 69 and 70 so that the signals of 1 Vp-p are converted into signals of 5 Vp-p, respectively, which are supplied to selectors 67 and 68.

In the second embodiment, when the normal mode is set by the test mode terminals AT and DT, the selectors 61, 62, 67 and 68 are set so as to transfer the output signals of the analog circuit 1 to the digital circuit 2, and the selectors 63 to 66 are set so as to transfer the output signals of the digital circuit 2 to the analog circuit 1.

In the digital test mode, small-amplitude signals applied through the input/output terminals $A_1$ and $A_2$ are converted into signals of 5 Vp-p by the level shifters 69 and 70, and then, supplied through the selectors 67 and 68 to the digital circuit 2. Since the signals applied through the input/output terminals $A_1$ and $A_2$ have only a small amplitude on the order of 1 Vp-p, there is no fear that the analog circuit 1 is broken. With this arrangement, accordingly, the input/output terminals for the analog circuit 1 can be widely utilized as the test terminals for the digital circuit 2.

In the second embodiment of the analog-digital mixed master in accordance with the present invention including the test circuit therein, even if the number of interconnections between the analog circuit 1 and the digital circuit 2 is large, the number of terminals can be reduced by commonly utilizing the terminals of the analog circuit 1 as the test terminals for the digital circuit 2.

In the case of testing the analog circuit 1, the input/output terminals of the digital circuit 2 are connected directly to the selectors without intermediary of the level shifters 69 and 70, so that the test can be carried out similarly to the first embodiment.

Figure 7:
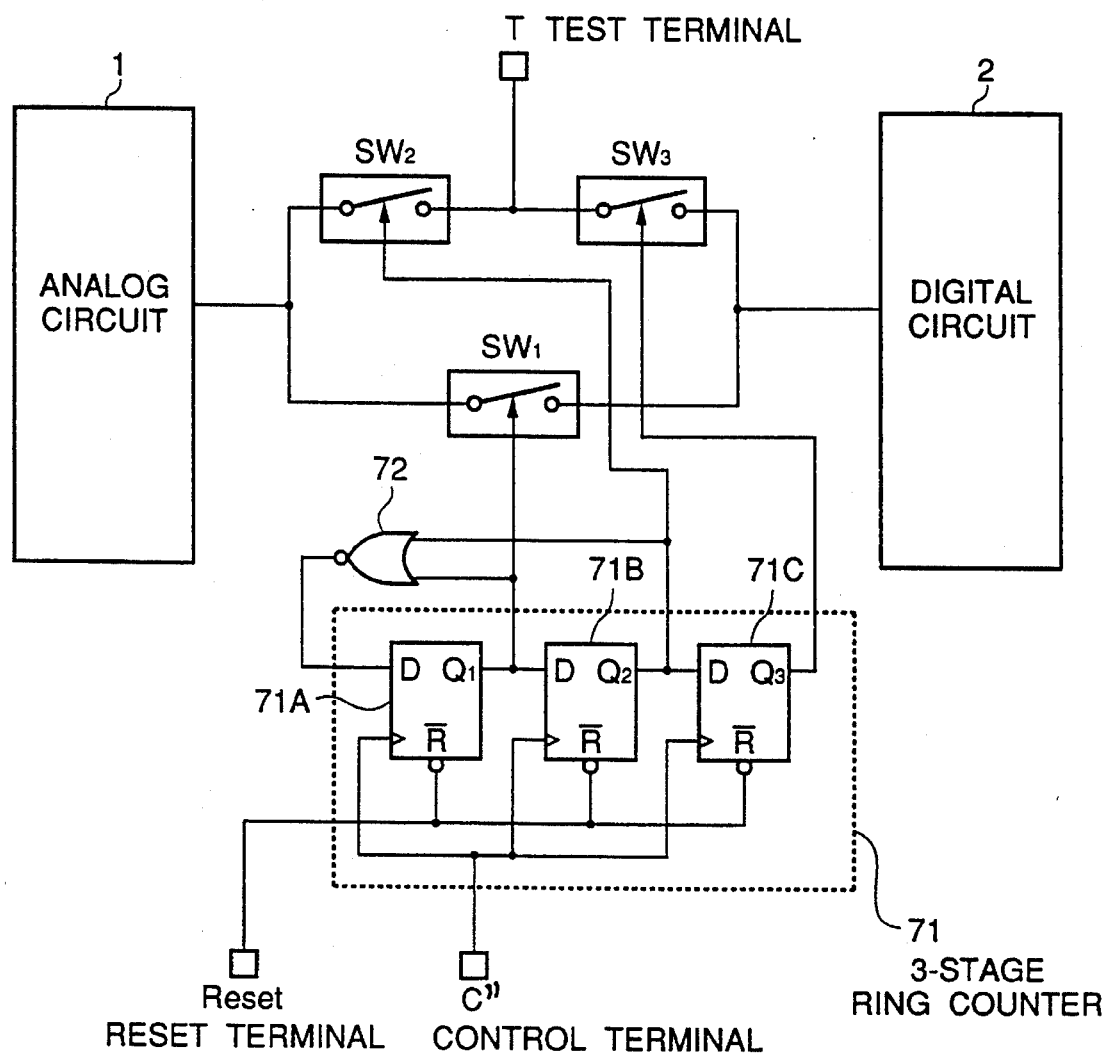
FIG. 7 is a logic circuit diagram of a third example of the selector circuit in the analog-digital mixed master in accordance with the present invention.

Referring to FIG. 7, there is shown a logic circuit diagram of a third example of the selector circuit in the analog-digital mixed master in accordance with the present invention.

In the selector shown in FIG. 7, one output (or input) of the analog circuit 1 is connected to a corresponding input (or output of the digital circuit 2 through an electronic switch $SW_1$ and also through two series-connected electronic switches $SW_2$ and $SW_3$ connected in parallel to the switch $SW_1$. A connection node between the switches $SW_2$ and $SW_3$ is connected to a corresponding test terminal. These switches $SW_1$, $SW_2$ and $SW_3$ are controlled by a 3-stage ring counter 71. The 3-stage ring counter 71 includes three D-type flipflops 71A, 71B and 71C having their clock input connected to a control terminal C" and their reset terminal $\overline{R}$ connected to a reset terminal "Reset". A Q output $Q_1$ of the flipflop 71A is connected to one input of a NOR gate 72 and a data input D of the flipflop 71B, and a Q output $Q_2$ of the flipflop 71B is connected to the other input of the NOR gate 72 and a data input D of the flipflop 71C. An output of the NOR gate 72 is connected to a data input D of the flipflop 71A. In addition, the Q output $Q_1$, $Q_2$ and $Q_3$ of the flipflops 71A, 71B and 71C are connected to a control input of the electronic switches $SW_1$, $SW_2$ and $SW_3$, respectively.

The following is the truth table of the 3-stage ring counter 71.

| Reset terminal | L | H | H | H |
|---|---|---|---|---|
| Number of risings at Terminal C | 0 | 1 | 2 | 3 |
| $Q_1$ | 0 | 1 | 0 | 0 |

-continued

| Reset terminal | L | H | H | H |
|---|---|---|---|---|
| $Q_1$ | 0 | 0 | 1 | 0 |
| $Q_1$ | 0 | 0 | 0 | 1 | where "L" means a low level, and "H" means a high level.

As shown in the above table, if the reset terminal "Reset" is brought to "0" so as to reset the three flipflops of the 3-stage ring counter 71, all the three outputs of the ring counter 71 are brought to "0". Next, if a signal is applied to the control terminal C" in the order of "0"→"1"→"0"→"1", • • • , the three outputs $Q_1$, $Q_2$ and $Q_3$ of the ring counter 71 are sequentially brought to "1" in response to the rising edges of the signal applied to the terminal C". Since the three outputs $Q_1$, $Q_2$ and $Q_3$ of the ring counter 71 are connected to the switches $SW_1$, $SW_2$ and $SW_3$, the switches $SW_1$, $SW_2$ and $SW_3$ are sequentially turned on. Accordingly, if the signal is applied to the control terminal C" in the order of "0"→"1"→"0"→"1", • • • , the mode is sequentially changed in the order of "normal mode"→"analog (or digital) test mode"→"digital (or analog) test mode"→"normal mode", • • • . Incidentally, as the reset terminal "Reset", a reset terminal common to the digital circuit 2 or a power-on reset circuit can be used.

In the embodiment shown in FIG. 7, therefore, the test mode switching terminal can be formed of only one terminal pin, and therefore, it is effective in reducing the number of terminal pins.

As will be seen from the above description with reference to the drawings, since the analog-digital mixed master in accordance with the present invention including a test circuit therein is such that the test circuit is formed as the under-layer of the LSI chip in the interfacing portion between the analog circuit section and the digital circuit section, it is easy to design the test, and when a malfunction occurs in the LSI, it is possible to simply determine in which of the analog circuit and the digital circuit the malfunction occurs.

Since the test program can be prepared for each of the analog circuit and the digital circuit, independently of each other, it is possible to reduce generation of bugs in the test programs, and therefore, it becomes easy to debug the test programs. Accordingly, the test program development term can be remarkably shortened.

In addition, since the test program for the analog circuit and the test program for the digital circuit can be separately prepared by different designers, an expert of an analog technique and an expert of a digital technique can prepare the Jest program for the analog circuit and the test program for she digital circuit, respectively, independently of each other. This is very efficient.

Furthermore, since the digital circuit can be tested by converting a simulated output of the gate array into a test pattern, it is possible to efficiently prepare the test pattern minimizing the mistakes therein.

In addition, as explained in connection with the second embodiment, when the number of interconnections between the analog circuit and the digital circuit is large, the number of terminals can be reduced by utilizing the terminals of the analog circuit as the test terminals for the digital circuit.

The invention has thus been shown and described with reference to the specific embodiments. However, it should be noted that the present invention is in no way limited to the details of the illustrated structures but changes and modifications may be made within the scope of the appended claims.

I claim:

1. A semiconductor integrated circuit comprising:

an analog circuit for processing input signals supplied thereto and for producing at least one first output signal;

a digital circuit for processing input signals supplied thereto and for producing at least one second output signal;

a first signal line, coupled between said analog circuit and said digital circuit, for transferring said first output signal to said digital circuit;

a second signal line, coupled between said digital circuit and said analog circuit, for transferring said second output signal to said analog circuit;

a first test mode terminal supplied with a first test mode signal, said first test mode signal taking one of an active level and an inactive level in accordance with operation modes;

a second test mode terminal supplied with a second test mode signal, said second test mode signal taking one of an active level and an inactive level in accordance with operation modes;

a first test signal input/output terminal;

a second test signal input/output terminal;

a first selector, inserted in said first signal line, for dividing said first signal line into first and second partial signal lines and coupled to said first and second test mode terminals and said first test signal input/output terminal; and a second selector, inserted in said second signal line, for dividing said second signal line into third and fourth partial signal lines and coupled to said first and second test mode terminals and said second test signal input/output terminal, said first selector including:

a first buffer having a first input node connected to said first partial signal line for receiving said first output signal and a first output node connected to said digital circuit through said second partial signal line, said first buffer for forming an electrical path between said first input node and said first output node when said first test mode signal takes said active level and bringing said first output node into a high impedance state when said first test mode signal takes said inactive level, and a first switching circuit connected between said first output node of said first buffer and said first test signal input/output terminal and for being rendered conductive to form an electrical path therebetween when at least one of said first and second test mode signals takes said inactive level and being rendered non-conductive to disconnect said first output node from said first test signal input/output terminal when both of said first and second mode signals take said active level, said second selector including:

a second buffer having a second input node connected to said third partial signal line for receiving said second output signal and a second output node connected to said analog circuit through said fourth partial signal line, said second buffer for forming an electrical path between said second input node and said second output node when said second test mode signal takes said active level and for bringing said second output node into a high impedance state when said second test mode signal takes said inactive level, and a second switch circuit connected between said second output node of said second buffer and said second test signal input/output terminal and rendered conductive to form an electrical path therebetween when at least one of said first and second test mode signals takes said inactive level and being rendered non-conductive to disconnect said second output node from said second test signal input/output terminal when both of said first and second test mode signals take said active level.

2. A semiconductor integrated circuit according to claim 1, wherein each of said first and second selectors provides an interface between said analog circuit and said digital circuit such that said analog circuit and said digital circuit are independently testable of one another and such that a condition of an interconnection between said analog circuit and said digital circuit is testable.

3. A semiconductor integrated circuit as claimed in claim 1, wherein said first switch circuit includes:

a third buffer having a third input node connected to said first test signal input/output terminal and a third output node connected to said first output node of said first buffer; and a fourth buffer having a fourth input node connected to said first output node of said first buffer and a fourth output node connected to said first test signal input/output terminal, and wherein said second switch circuit includes:

a fifth buffer having a fifth output node connected to said second output node of said second buffer and a fifth input node connected to said second test signal input/output terminal; and a sixth buffer having a sixth input node connected to said second output node of said second buffer and a sixth output node connected to said second test signal input/output terminal, each of said third and sixth buffers for forming an electrical path between an associated one of said third and sixth input nodes and an associated one of said third and sixth output nodes when said first test mode signal takes said inactive level and for bringing said associated one of said third and sixth output nodes into a high impedance state when said first test mode signal takes said active level, and each of said fourth and fifth buffers for forming an electrical path between an associated one of said fourth and fifth input nodes and an associated one of said fourth and fifth output nodes when said second test mode signal takes said inactive level and for bringing said associated one of said fourth and fifth output nodes into a high impedance state when said second test mode signal takes said active level.

4. A semiconductor integrated circuit comprising:

an analog circuit for processing input signals supplied thereto and for producing at least one first output signal;

a digital circuit for processing input signals supplied thereto and for producing at least one second output signal;

a first signal line, coupled between said analog circuit and said digital circuit, for transferring said first output signal to said digital circuit;

a second signal line, coupled between said digital circuit and said analog circuit, for transferring said second output signal to said analog circuit; a first test mode terminal supplied with a first test mode signal, said first test mode signal taking one of an active level and an inactive level in accordance with operation modes;

a second test mode terminal supplied with a second test mode signal, said second test mode signal taking one of an active level and an inactive level in accordance with operation modes;

a first test signal input/output terminal;

a second test signal input/output terminal;

a first selector, inserted in said first signal line, for dividing said first signal line into first and second partial signal lines and coupled to said first and second test mode terminals and said first test signal input/output terminal, said first selector for forming a signal transmission path between said first and second partial signal lines when said first test mode signal takes said active level, said first selector for disconnecting between said first and second partial signal lines and for forming a signal transmission path between said second partial signal line and said first test signal input/output terminal when said first test mode signal takes said inactive level; and a second selector, inserted in said second signal line, for dividing said second signal line into third and fourth partial signal lines and coupled to said first and second test mode terminals and said second test signal input/output terminal, said second selector for forming a signal transmission path between said third and fourth partial signal lines when said second test mode signal takes said active level, said second selector for disconnecting between said third and fourth partial signal lines and for forming a signal transmission path between said fourth partial signal line and said second test signal input/output terminal when said second test mode signal takes said inactive level, said first selector including:

first logic gate means having an input connected to said first partial signal line, for receiving said first output signal and an output connected to said second partial signal line, said first logic gate means being controlled by said first and second mode signals so that when both of said first and second mode signals take said active level, said first logic gate means forms said signal transmission path between said first and second partial signal lines, and when at least one of said first and second test mode signals takes said inactive level, said first logic gate means disconnects between said first and second partial signal lines, analog switch means having a first end connected to said first partial signal line and a second end connected to said first test signal input/output terminal, said analog switch means being controlled by said second test mode signal to be closed when said second test mode signal takes said inactive level and to be opened when said second test mode signal takes said active level, and second logic gate means having an input connected to said second end of said analog switch means and an output connected to said second partial signal line, said second logic gate means being controlled by said first test mode signal so that when said first test mode signal takes said inactive level, said second logic gate means forms a signal transmission path between said second end of said analog switch means and said second partial signal line, and when said first test mode signal takes said active level, said second logic gate means disconnects between said second end of said analog switch means and said second partial signal line.

5. A semiconductor integrated circuit as claimed in claim 4, wherein said first logic gate means includes:

a NOR gate having first and second inputs connected to said first and second test mode terminals; and a first AND gate having a first input connected to said first partial signal line and a second input connected to an output of said NOR gate, and wherein said second logic gate means includes a second AND gate having a first input connected to said second end of said analog switch means and a second input connected to said first test mode terminal, an output of each of said first and second AND gates being connected to an OR gate having an output connected to said second partial signal line.

6. A semiconductor integrated circuit according to claim 4, wherein each of said first and second selectors provides an interface between said analog circuit and said digital circuit such that said analog circuit and said digital circuit are independently testable of one another and such that a condition of an interconnection between said analog circuit and said digital circuit is testable.

7. A semiconductor integrated circuit comprising:

an analog circuit for processing input signals supplied thereto and for producing at least one first output signal, said analog circuit also having at least one analog signal input;

a digital circuit for processing input signals supplied thereto and for producing at least one second output signal;

a first signal line, coupled between said analog circuit and said digital circuit, for transferring said first output signal to said digital circuit;

a second signal line, coupled between said digital circuit and said analog circuit, for transferring said second output signal to said analog circuit; a first test mode terminal supplied with a first test mode signal, said first test mode signal taking one of an active level and an inactive level in accordance with operation modes;

a second test mode terminal supplied with a second test mode signal, said second test mode signal taking one of an active level and an inactive level in accordance with operation modes;

a first test signal input/output terminal;

a second test signal input/output terminal;

a first selector, inserted in said first signal line, for dividing said first signal line into first and second partial signal lines and being coupled to said first and second test mode terminals and said first test signal input/output terminal, said first selector for forming a signal transmission path between said first and second partial signal lines when said first test mode signal takes said active level, said first selector for disconnecting between said first and second partial signal lines and for forming a signal transmission path between said second partial signal line and said first test signal input/output terminal when said first test mode signal takes said inactive level;

a second selector, inserted in said second signal line, for dividing said second signal line into third and fourth partial signal lines and being coupled to said first and second test mode terminals and said second test signal input/output terminal, said second selector forming a signal transmission path between said third and fourth partial signal lines when said second test mode signal takes said active level, said second selector for disconnecting between said third and fourth partial signal lines and for forming a signal transmission path between said fourth partial signal line and said second test signal input/output terminal when said second test mode signal takes said inactive level;

a level shifter having an input connected to said analog signal input of said analog circuit, for convening a small-amplitude signal applied to said analog signal input of said analog circuit into a signal having a digital signal amplitude; and a third selector connected between an output of said level shifter and said digital circuit and being controlled by said first and second test mode terminals so that when said digital circuit is tested, said signal having the digital signal amplitude which is outputted from said level shifter and which is obtained from said small-amplitude signal applied to said analog signal input of said analog circuit, is supplied to said digital circuit.

8. A semiconductor integrated circuit according to claim 7, wherein each of said first and second selectors provides an interface between said analog circuit and said digital circuit such that said analog circuit and said digital circuit are independently testable of one another and such that a condition of an interconnection between said analog circuit and said digital circuit is testable.

* * * * *